US007239737B2

(12) United States Patent
Luque et al.

(10) Patent No.: US 7,239,737 B2
(45) Date of Patent: Jul. 3, 2007

(54) USER INTERFACE FOR QUANTIFYING WAFER NON-UNIFORMITIES AND GRAPHICALLY EXPLORE SIGNIFICANCE

(75) Inventors: Jorge Luque, Redwood City, CA (US); Andrew D. Bailey, III, Pleasanton, CA (US); Mark Wilcoxson, Piedmont, CA (US)

(73) Assignee: Lam Research Corporation, Fremont, CA (US)

( * ) Notice: Subject to any disclaimer, the term of this patent is extended or adjusted under 35 U.S.C. 154(b) by 792 days.

(21) Appl. No.: 10/331,194

(22) Filed: Dec. 24, 2002

(65) Prior Publication Data

US 2004/0070623 A1     Apr. 15, 2004

Related U.S. Application Data

(60) Provisional application No. 60/414,021, filed on Sep. 26, 2002.

(51) Int. Cl.
G06K 9/00 (2006.01)
G11B 27/00 (2006.01)

(52) U.S. Cl. .................. 382/141; 382/173; 715/716
(58) Field of Classification Search ........ 382/141–152, 382/173; 715/716–726
See application file for complete search history.

(56) References Cited

U.S. PATENT DOCUMENTS

| | | | |
|---|---|---|---|
| 5,761,064 A | 6/1998 | La et al. | |
| 5,939,719 A | 8/1999 | Park et al. | |
| 6,128,403 A * | 10/2000 | Ozaki | 382/145 |
| 6,477,685 B1 | 11/2002 | Lovelace | |
| 6,493,082 B2 * | 12/2002 | Nara et al. | 356/394 |
| 6,597,381 B1 * | 7/2003 | Eskridge et al. | 715/804 |
| 6,744,913 B1 * | 6/2004 | Guest et al. | 382/145 |
| 2001/0000460 A1 | 4/2001 | Ishihara et al. | |
| 2001/0001015 A1 | 5/2001 | Ishikawa et al. | |
| 2002/0051565 A1 | 5/2002 | Hiroi et al. | |
| 2002/0102747 A1 | 8/2002 | Muradian et al. | |
| 2006/0002606 A1 * | 1/2006 | Do | 382/145 |

FOREIGN PATENT DOCUMENTS

EP          0398781 A2     11/1990

OTHER PUBLICATIONS

Rodgers et al, Application of the Atomic Force Microscope to Integrated Circuit Failure Analysis, Database Inspec 'Online! 1993, pp. 1947-1956, vol. 33, No. 11-12, U.K.

* cited by examiner

*Primary Examiner*—Bhavesh M Mehta
*Assistant Examiner*—Aaron Carter
(74) *Attorney, Agent, or Firm*—Martine Penilla & Gencarella, LLP

(57) ABSTRACT

A graphical user interface for controlling analysis of a wafer map is provided. The user interface provides a graphical selection control for selecting a region of the wafer map for statistical analysis. The user interface is configured to generate statistical data for the selected region to complete the statistical analysis. The statistical data is then displayed for the selected region. Re-generation of the statistical data for display is performed upon detecting a change in the selected region.

22 Claims, 10 Drawing Sheets

USER INTERFACE FOR QUANTIFYING WAFER NON-UNIFORMITIES AND GRAPHICALLY EXPLORE SIGNIFICANCE

CROSS REFERENCE TO RELATED APPLICATIONS

This application claims priority from U.S. Provisional Patent Application No. 60/414,021 filed on Sep. 26, 2002, and entitled "Method for Quantifying Uniformity Patterns and Including Expert Knowledge for Tool Development and Control," which is incorporated herein by reference in its entirety.

BACKGROUND OF THE INVENTION

1. Field of the Invention

The present invention relates generally to methods for quantifying post process uniformity of semiconductor wafers, and more particularly, to graphical user interfaces that enable real-time graphical analysis of uniformity metrics before and after process operations.

2. Description of the Related Art

Semiconductor wafers undergo numerous processes during the semiconductor manufacturing process. Layers may be added, patterned, etched, removed, polished and many other processes. After each process the wafer is typically examined to confirm the previous process was completed with an acceptable level of errors or nonuniformities. The various operating variables (e.g., event timing, gas pressure, concentrations, temperatures, etc.) of each process the wafer is processed through are recorded so that any changes in any variable may be quickly identified and potentially correlated to any errors or nonuniformities discovered when the wafer is examined.

FIG. 1A shows a typical etched wafer 100. A top layer of material was mostly removed from the wafer in the etch process except for a portion 106 of the top layer. For clarity purposes, the portion 106 is a portion of a layer or ultrathin film. A notch 104 is typically included in each wafer 100 so that the wafer can be oriented (aligned) in the same position during the various manufacturing processes. The portion 106 is a nonuniform portion of the surface of the wafer 100 and therefore can be termed a nonuniformity. As shown, the portion 106 is in the approximate form of a ring or annular shape where the top layer was removed from the center and around the edges of the wafer 100.

FIG. 1B shows another typical etched wafer 120. A portion 108 of a top layer remains, when the top layer was mostly removed in the etch process. The portion 108 is typically termed an azimuthal-type nonuniformity on the surface of wafer 120 because the nonuniformity 108 is not the same at the same radius around the wafer 120.

Prior art approaches to describing nonuniformities 106, 108 include subjective, verbal descriptions such as "center-fast" for annular nonuniformity 106 or "left side slow" for azimuthal nonuniformity 108. Center-fast generally describes wafer 100 because material from the center of the wafer 100 is removed faster than the material in the annular region 106. However, center-fast does not provide a specific, objective and quantitative description of the nonuniformity 106. Similarly, left side slow describes wafer 120 because the etch process removed material from the left side region 108 slower than the other regions of the wafer 120 but left side slow also fails to provide a specific, objective and quantitative description of the nonuniformity 108.

The descriptions of the nonuniformities 106, 108 are used to provide feedback to correct errors and inconsistencies in the etch and other preceding processes that were performed on the wafers 100, 120. The descriptions of the nonuniformities 106, 108 can also be used to track the impact of the nonuniformities 106, 108 on subsequent semiconductor manufacturing process and on metrics from completed semiconductor devices (e.g., device yields, performance parameters, etc.)

As nonuniformities become smaller and smaller, the nonuniformities become less symmetrical and also more difficult to accurately describe with the subjective, verbal descriptions. FIG. 1C shows a typical wafer 150 with multiple, asymmetrical nonuniformities 152A–G. The nonuniformities 152A–G can be smaller and are less symmetrical than nonuniformities 106, 108 because the various variables in the etch and other previous processes are very stringently controlled. The subjective, verbal descriptions have therefore become insufficient to accurately describe the nonuniformities 152A–G so that further improvements in the preceding processes can be successfully completed.

A more objective description of wafer uniformity is referred to as a 3-sigma uniformity metric. The 3-sigma uniformity metric quantifies a standard deviation of measurements of some quantity of the wafer. By way of example, the 3-sigma can be an expression of the deviations in thickness of the wafer detected by an array of measurement points across the wafer. FIG. 1D shows a typical 49-point array used in completing a measurement scan of wafer 160. The thickness of the wafer 160 is measured at each of the 49 points. The 49-points are arranged with a center point 162, and three concentric rings 164, 168, 172. The inner ring 164 has 8 evenly spaced points. The intermediate ring 168 has 16 evenly spaced points. The outer ring 172 has 24 evenly spaced points. The rings 164, 168, 172 are typically approximately equally spaced radially from the center point 162. Each of the points in the rings 164, 168, 172 and the center point 162 is typically assigned to represent a given portion of the wafer 160. For example, a typical wafer 160 has a 3 mm exclusion zone on the outer perimeter of the wafer 160. The rings 164, 168, 172 and the center point 162 are spaced equidistant and therefore each of the 49 points represent about $1/49^{th}$ of the area of the wafer 160, less the 3 mm exclusion zone (i.e., the outer edge of the wafer where expected process abnormalities occur). Because nonuniformities do not suddenly appear under a single scan point, the nonuniformities are smoothed due to the choice of measuring points.

The 3-sigma uniformity metric is conventionally defined to be equal to 3 times the standard deviation of the measurements on the wafer 160. The standard deviation of the thickness of the wafer 160 is determined by a sum of the thickness of the wafer 160 at each of the 49 scanned points divided by 49 times the mean thickness of the wafer. A typical 3-sigma metric of a wafer is reported as a percentage of uniformity (0% being ideal). The 3-sigma metric is also often referred to as the WIWNU metric (within wafer nonuniformity).

A 3-sigma metric provides a single, objective, quantitative, summary description of the magnitude of the nonuniformities 152A–G. Additional metrics include skewness and kurtosis, which can be derived from the measured array data. However, these metrics do not provide sufficient information to specifically identify the location and shape of the nonuniformities on the wafer 160.

In addition, simply adding more scan points to areas of interest does not provide for improved understanding of a non-uniformity. In fact, when more points are added to a particular location (e.g., such as near the edge of the wafer), the additional points can have the downside of improperly skewing the wafer non-uniformity metrics, which are calculated for the entire wafer surface.

In view of the foregoing, there is a need for a computer user interface that enables the display of uniformity metrics in a graphical manner so that their significance can be adequately explored.

SUMMARY OF THE INVENTION

Broadly speaking, the present invention fills these needs by providing a graphical user interface that can provide user interactive selection of sub-population regions for analysis. For a sub-population region, metrics defining in detail that region are displayed and updated upon detecting a change (i.e., by a user graphical change) in the sub-population region. It should be appreciated that the present invention can be implemented in numerous ways, including as a process, an apparatus, a system, computer readable media, or a device. Several inventive embodiments of the present invention are described below.

In one embodiment, a graphical user interface for controlling analysis of a wafer map is disclosed. The user interface provides a graphical selection control for selecting a region of the wafer map for statistical analysis. The user interface is configured to generate statistical data for the selected region to complete the statistical analysis. The statistical data is then displayed for the selected region. Re-generation of the statistical data for display is performed upon detecting a change in the selected region.

In another embodiment, a graphical user interface for analyzing data used to generate a wafer map is disclosed. The wafer map identifies a uniformity profile of a surface that has been etched. The user interface includes spatial distribution options for selecting sub-population data associated with the uniformity profile of the surface. The sub-population data is a targeted region of the wafer that is less than the entire wafer surface. The interface enables graphical selection of a particular spatial distribution option, and enables graphical identification of a region. The region is for the sub-population data. The user interface displays metrics for the region, and the metrics are automatically updated upon detecting a change in the graphical identification of the region.

In yet another embodiment, a graphical user interface for displaying and graphically controlling selection of metrics to analyze post process wafer surface areas is disclosed. The user interface receives data used to generate a wafer map. The wafer map identifies a uniformity profile of a surface that has been etched. The user interface includes spatial distribution options for selecting sub-population data associated with the uniformity profile of the surface. The sub-population data is a targeted region of the wafer that is less than the entire wafer surface. The interface enables graphical identification of a region using a particular spatial distribution option, and the region is for the sub-population data. Metrics for the region are displayed. The metrics are automatically updated upon detecting a change in the graphical identification of the region.

The present invention provides multiple, objective metrics that specifically define a non-uniformity on a wafer. The objective metrics are provided through a user interface that can be easily adjusted to identify specific sub-population regions of the wafer for more intense analysis. The multiple, objective metrics can be used to specifically characterize the non-uniformity and the wafer. The specific characterizations can then be accurately, objectively and even automatically compared to other characterized wafers. Accurate comparison of characterized wafers will allow more direct causal correlation between manufacturing process variables and an occurrence of a given non-uniformity on a wafer. A more direct causal correlation between manufacturing process variables and an occurrence of a given non-uniformity on a wafer allows more accurate refinement of the manufacturing process variables.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

Disclosed is a graphical user interface for displaying, graphically selecting particular regions of a wafer map for analysis, and displaying specific metrics that describe non-uniformities at the selected particular regions. It will be apparent to those skilled in the art that the present invention may be practiced without some or all of the specific details set forth herein.

As an overview, the graphical user interface of the present invention is termed a wafer viewer 200. Defined in more detail below are the selectable spatial distribution types, which include, a center-to-edge distribution, an annular distribution, and a side-to-side distribution. The specific locations for analysis (e.g., sub-population) can be graphically selected and adjusted. Any change or adjustment will automatically provide feedback in the form of metrics that define the non-uniformities at the selected location. As defined below, there is a black region, which defines statistics for the area covered by the black selection distribution shape. The complementary statistics are likewise provided for the resulting white selection distribution shape.

In general, a set of data measurement points $z_i$ at locations $(x_i, y_i)$ across a wafer defined by $x^2+y^2<=R^2$, where R is the radius of the wafer. Normal uniformity metrics calculate the mean and standard deviation of all points $z_i$. As mentioned, the class of metrics defined herein are based on defining specific regions $P(a,b,c \ldots)$ that are functions of parameters a,b,c, etc. The metrics are then calculated by limiting the summation to $z_i$, such that $(x_i, y_i)$ is within region $P(a,b,c \ldots)$. These are the "black" area statistics. Complementary "white" area statistics can be calculated on $z_i$ such that $(x_i, y_i)$ is within the wafer minus the "black" region $P(a,b,c \ldots)$.

Figure 1A:
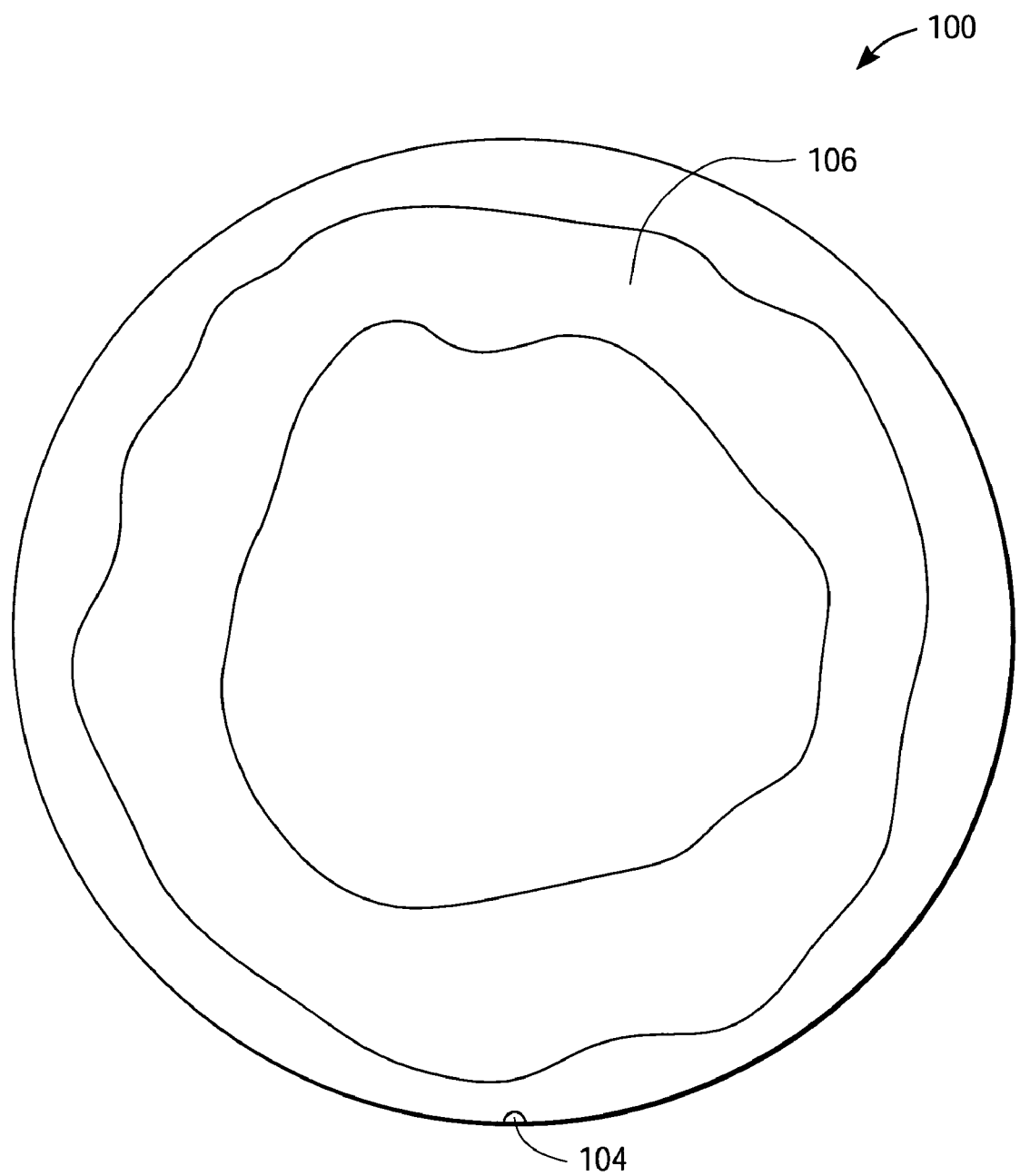
FIGS. 1A–1D illustrate non-uniformities often encountered in post wafer etch analysis.
Figure 1B:
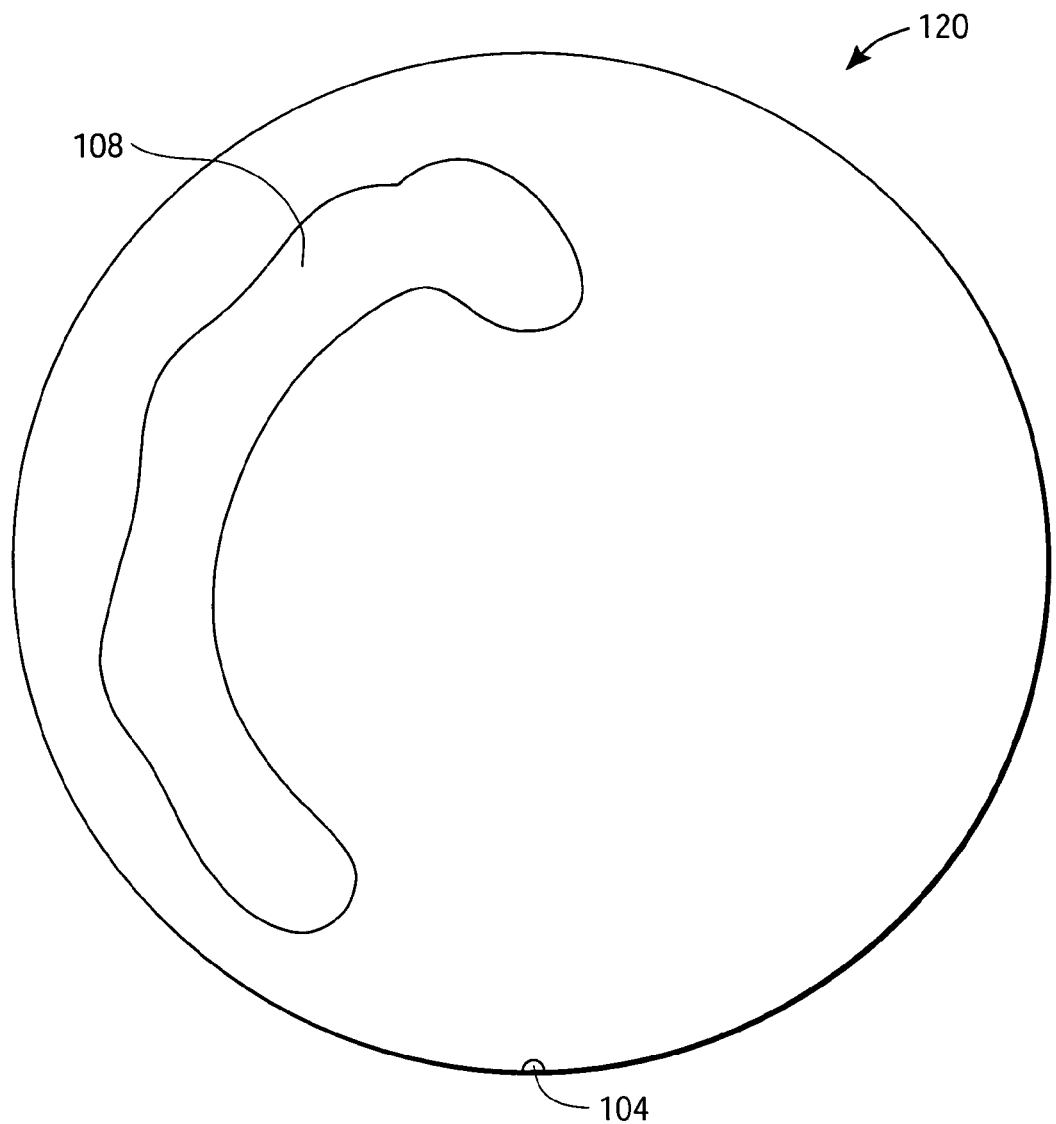
Figure 1C:
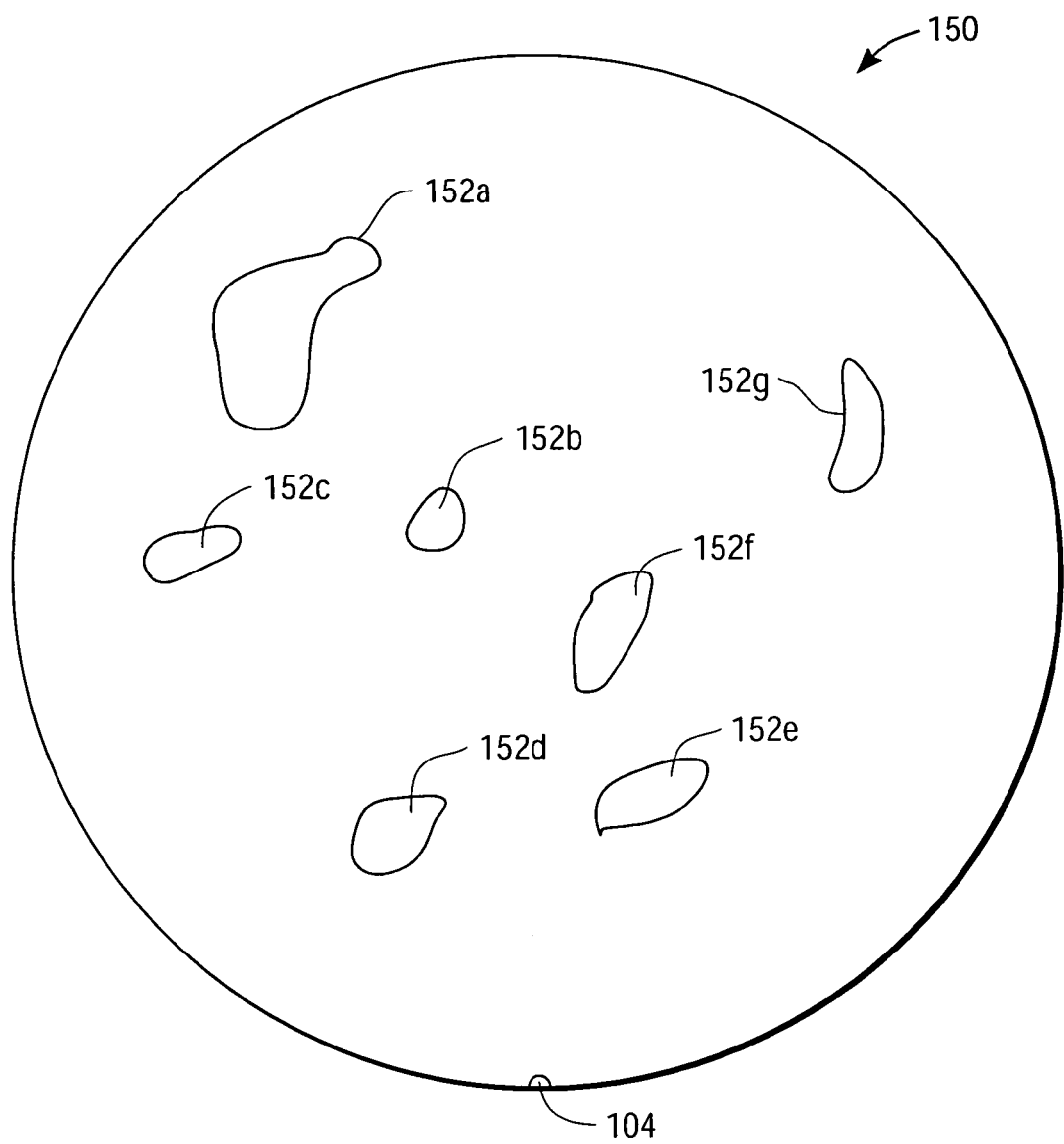
Figure 1D:
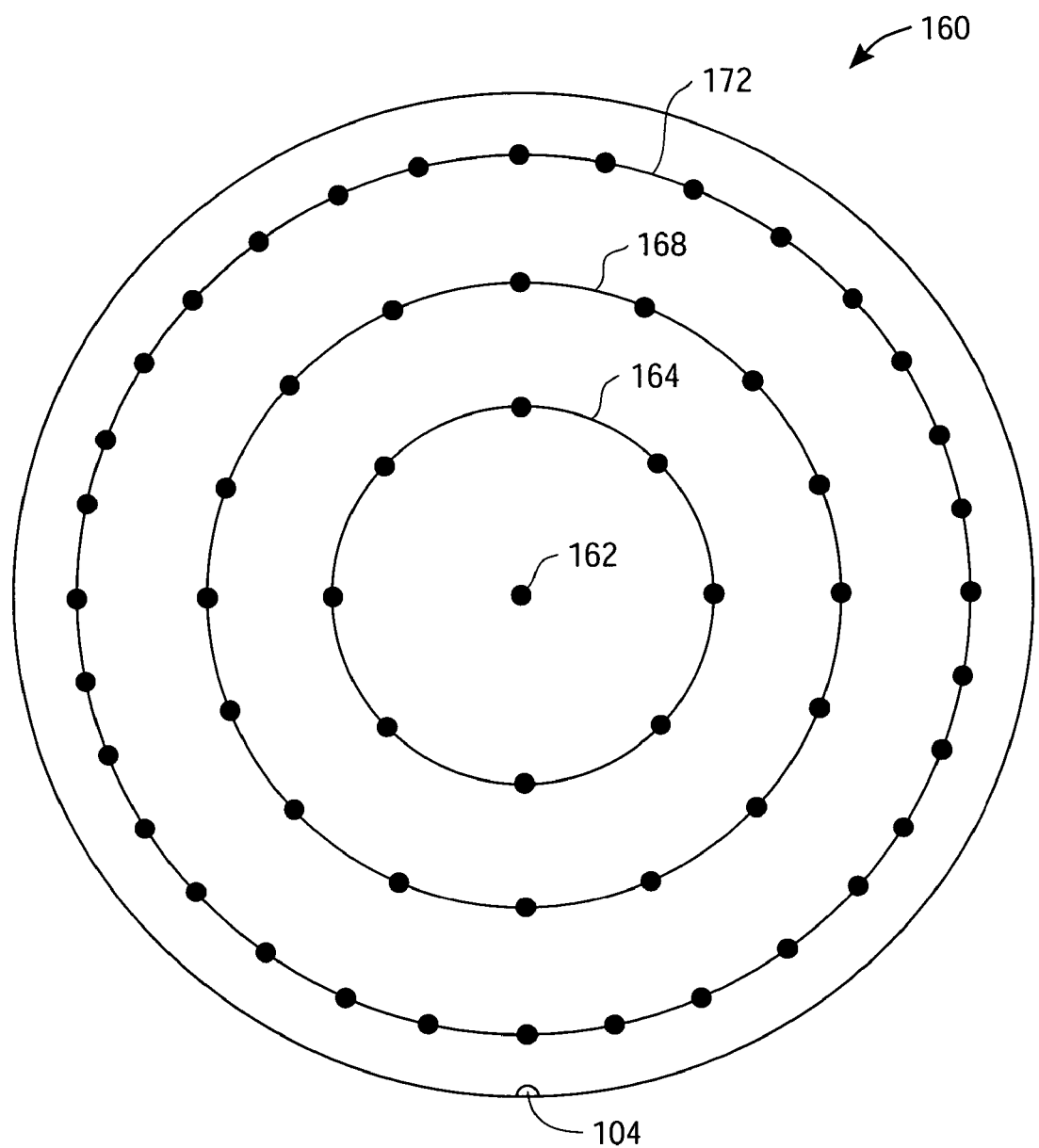
Figure 2A:
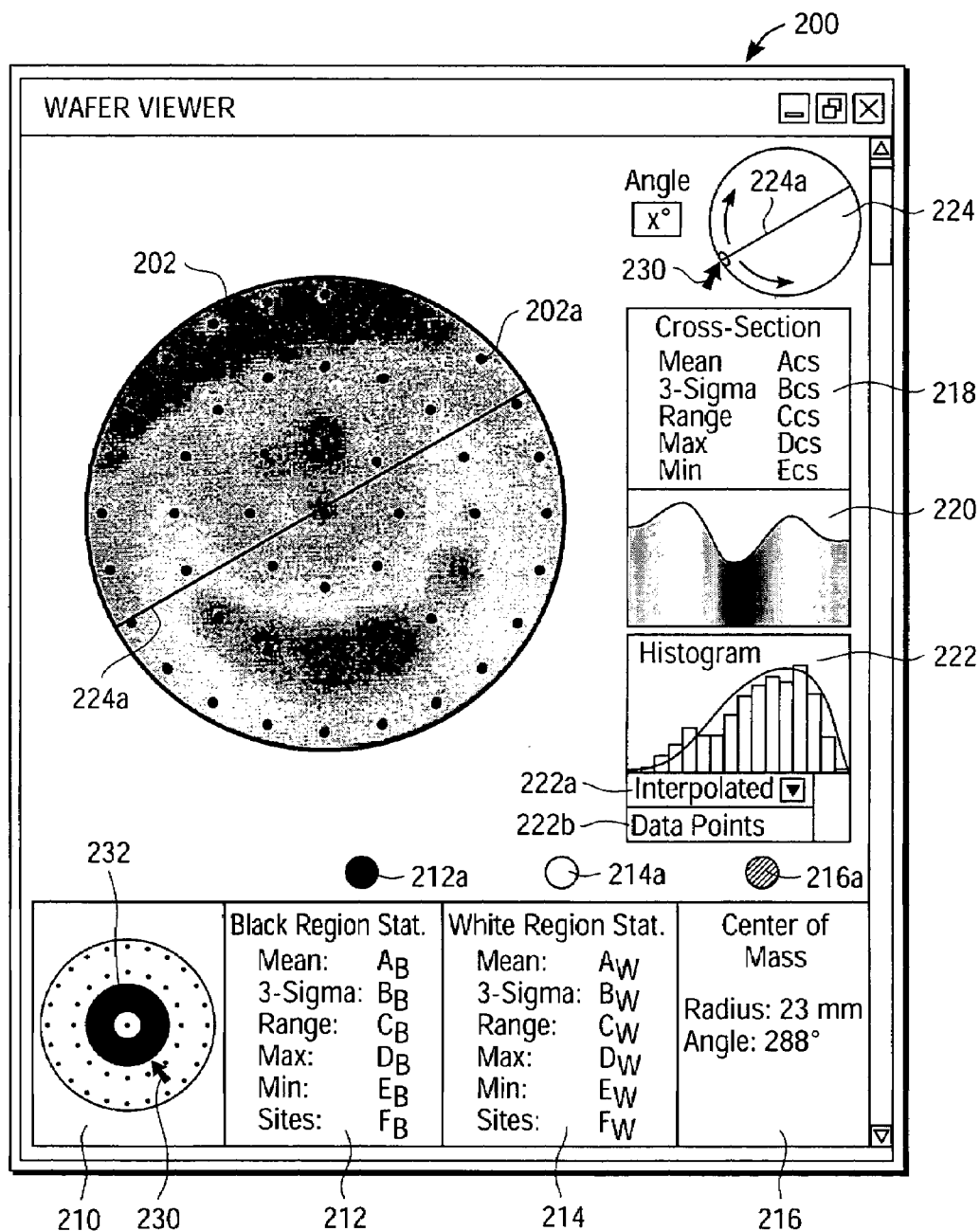
FIGS. 2A–4B illustrate graphical user interface functionality provided by a wafer viewer, in accordance with one embodiment of the present invention.

With this overview in mind, FIG. 2A illustrates a graphical user interface of a wafer viewer 200, in accordance with one embodiment of the present invention. As shown, a wafer map 200 depicts the thickness of material (i.e., layers, films, etc.) remaining on a wafer after a process operation has been completed. Also illustrated, colors or gray scales are used to graphically show the inherent non-uniformities. As used herein, the wafer operation is an etch operation, although it is well known that other processes may also be performed on a wafer, and such results may also need to be analyzed. As mentioned below, analysis is also possible to compare and quantify wafer-to-wafer statistics.

The wafer viewer 200 includes a number of graphical controls and statistical results that can be obtained and displayed using the data that results from scan points 200a throughout the wafer. As mentioned above, a wafer typically will include 49 scan points 200a, although additional scan points may be added to particular regions if more detailed analysis is required of a particular region. This is sometimes needed in areas of expected non-uniformities, such as the wafer edge.

A spatial control 210 is provided for enabling graphical control and selection of particular portions of the wafer map 202. As shown, a pointer 230 may graphically select an annular control 232 to select particular annular regions for analysis. As noted above, annular control 232 is useful for when specific areas need to be targeted for more detailed analysis, such as areas near the outer edge of the wafer. The annular control 232 is defined by a black identifier 212a. The black and white identifiers 212a and 214a define which portions or regions of the wafer map 202 are being analyzed. The resulting data, is presented in the black region statistics 212 box, and the white region statistics 214 box.

Figure 2B:
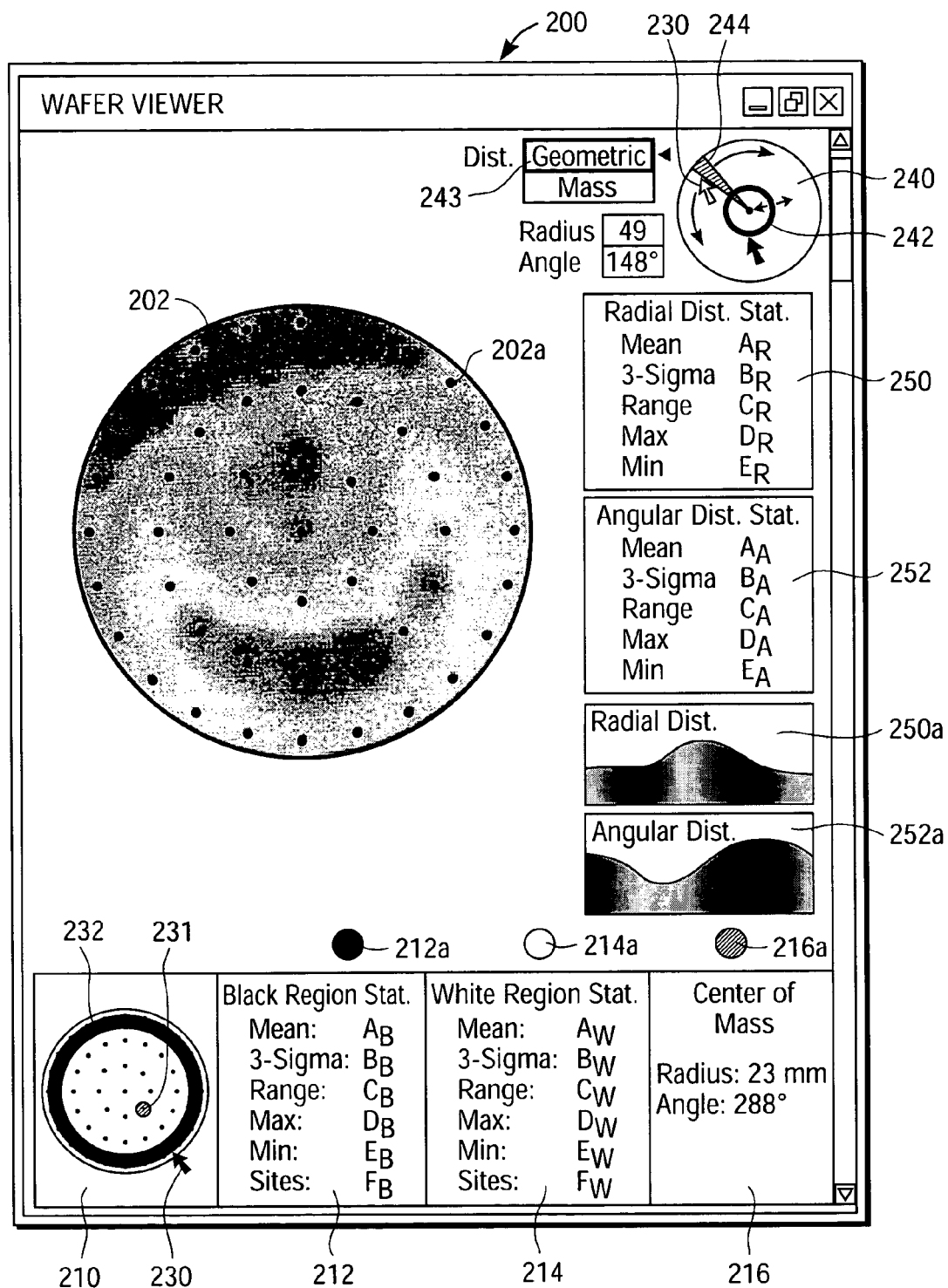

Depending upon the location of the annular control 232, which may be extended to different annular location as shown in FIG. 2B, the black region statistics and the white region statistics 212 and 214, respectively, will automatically be calculated and displayed for the user (i.e., any time a change is made). As shown, the statistics of each of the black and white regions include a calculation for a mean, a 3-sigma, a range, a maximum, a minimum, and sites. Each of the values of the statistics is shown generically as A, B, C, D, E, and F. A subscript B is provided for the black region, and a subscript W is provided for the white region. Accordingly, as the pointer 230 is used to change the diameter of the annular control 232 in the spatial control 210, the statistics for the black region 212 and the white region 214 will adjust to provide the user with detailed analysis of those particular regions.

As used herein, the black region statistics define the regions that are selected for analysis within the black shaded region, and the white regions define the statistics for the unselected areas in the spatial control 210. A center of mass coordinates 216 display is also provided. Calculation of the center of mass and description of its usefulness for analysis is provided in co-pending patent application entitled "System and Method for Quantifying Uniformity Patterns for tool Development and Monitoring", having U.S. patent application Ser. No. 10/327,233, filed on the same day as the instant application, and which is incorporated herein by reference. The center of mass is illustrated in polar coordinates with a defined radius and a defined angle. The radius in this example is shown to be 23 mm away from the center of the wafer, and at an angle of 288 degrees. A center of mass indicator is provided in FIG. 2B, FIG. 3A, FIG. 3B, FIG. 5, and FIG. 6.

Continuing with the description of FIG. 2A, a cross-section control 224 is provided to enable a user to graphically control the cross-section that is of interest across the wafer map 202. The cross-section control 224 includes a cross-section line control 224a which may be graphically moved or dragged using a pointer 230. An angle (shown as X degrees) is then displayed to show the user where the cross-section control is currently standing with respect to the wafer map 202. The user can also type in an exact angle for analysis.

Upon defining the appropriate angle for the cross-section control line 224a, the cross-section statistics 218, cross-section graph 220, and histogram graph 222 are displayed. The cross-section statistics 218 are similar to statistics for the black region statistics 212 and the white region statistics 214. A subscript CS is provided for each one of the values in the cross-section statistics portion 218. Along with the cross-section statistics 218, the cross-section graph 220 will provide the user with an immediate display of the topographic variation, which in a preferred embodiment, is provided by a color-coded cross-sectional graph 220. The color-coded cross-sectional graph 220 is correlated to the particular cross-section selected using the cross-section control 224. Broadly speaking, the histogram graph 222 is provided with choices for selecting interpolated data 222a, or data points 222b. The appropriate selection will then be displayed in the histogram graph 222. Using these analytical tools and the methods provided by the pin-pointed statistics, a user will be able to concentrate on particular regions of the wafer map 222 for analysis, and subsequent adjustments can be made to improve future process conditions. The purpose of the histogram function is to evaluate the Gaussian distribution of data points. The plot contains the ideal Gaussian distribution calculated with the mean and standard deviation from wafer statistics (continuous line). The bar plot is the actual distribution of wafer points. Each bar represents one quarter of the standard deviation from the wafer statistics. The text box under the plot allows switching the data source between actual points and interpolated points. The interpolated map source gives a smoother distribution.

To this end, particular attention should be placed on the fact that analysis is allowed to be performed for particular regions (sub-population regions) of the wafer map 202, as opposed to simply providing subjective descriptions of whole wafer non-uniformities as described in the background section.

FIG. 2B illustrates additional features and functionalities provided by the wafer viewer 200, in accordance with one embodiment of the present invention. In FIG. 2B, the spatial control 210 is provided with the pointer 230 dragging the annular control 232 to an outer edge of the wafer map 202. When the annular control 232 is moved to the outer edge, the center of mass indicator 231 is shown, which corresponds to the center of mass coordinates 216 that are illustrated by cross hatch 216a.

As mentioned above, wafers often are susceptible to process variations near the outer edge, and thus, specific analysis can be performed in the outer edge region by moving the annular control 232 to that location, and reading the black region statistics 212. The white region statistics 214 will thus provide the information for the non-blacked regions in the spatial control 210.

Reference is also drawn to a radial/angular distribution control 240. The radial/angular distribution control 240 is provided with a radial control 242, and an annular control 244. The pointer 230 is shown capable of dragging the annular control 244 to different radii around the radial/annular distribution control 240 icon. In addition, the pointer 230 can also drag the radial control 242 to different radial locations to provide for more specific analysis of selected points on the wafer map 202.

Radial distribution statistics 250 are provided for the particular radial region, and an angular distribution statistics 252 is provided for that particular angular distribution. As was defined before, the process metrics are defined by A, B, C, D, and E. A subscript R is provided for the radial distribution statistics 252, and a subscript A is provided for the angular distribution statistics 252. In addition, a radial distribution graph 250*a* and an angular distribution graph 252*a*, are provided to assist in displaying the topographic distribution at the particular location of interest. These graphs are also automatically regenerated anytime an adjustment is made for the selection.

Figure 3A:
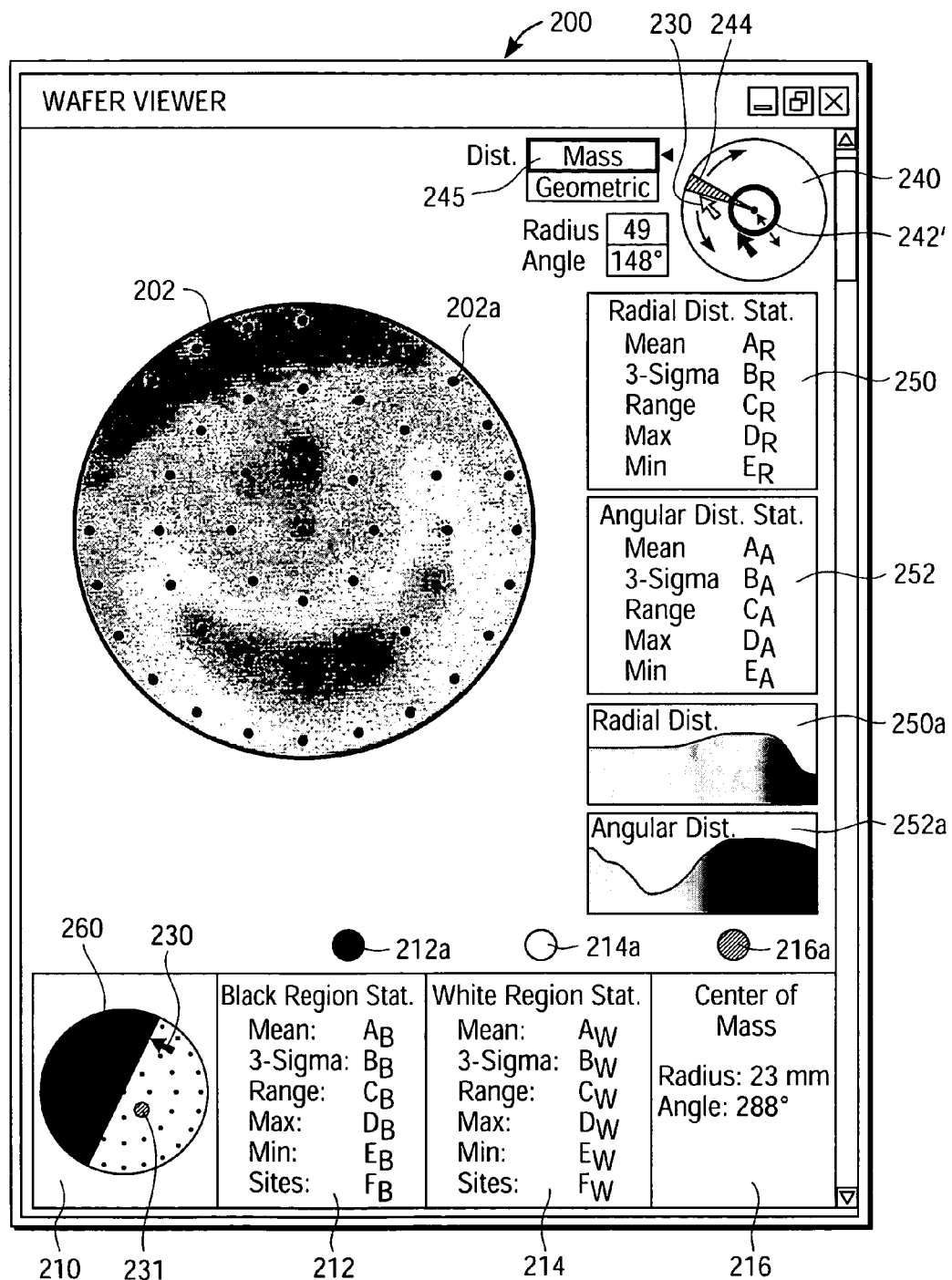

In this example, a geometric distribution 243 is selected, and for purposes of illustration, a radius of 49 mm from the center of the wafer and an angle of 148, is provided. When mass is selected for the distribution as shown in FIG. 3A, by center of mass selection 245, the radial control 242 is shifted to a location that surrounds the center of mass location. The center of mass location, as shown in the spatial control 210*a*, is approximately below and to the right of the center of the wafer. Positioned from the center of mass distribution point, it is possible to control the radial control 242 as well as the annular control 244, to specific locations to provide detailed analysis for the radial distribution statistics 250, and the angular distribution statistics 252.

FIG. 3A further illustrates another embodiment in which a side-to-side control 260 is provided in the spatial control 210. The side-to-side control 260 is also graphically illustrated and can be controlled using a pointer 230 to define the particular side-to-side region that will be the point of analysis in the black region statistics 212. The white region statistics 214 will thus display the data for the unselected regions. The center of mass 216 will still remain at the same position no matter what the display selection is in the spatial control 210.

Figure 3B:
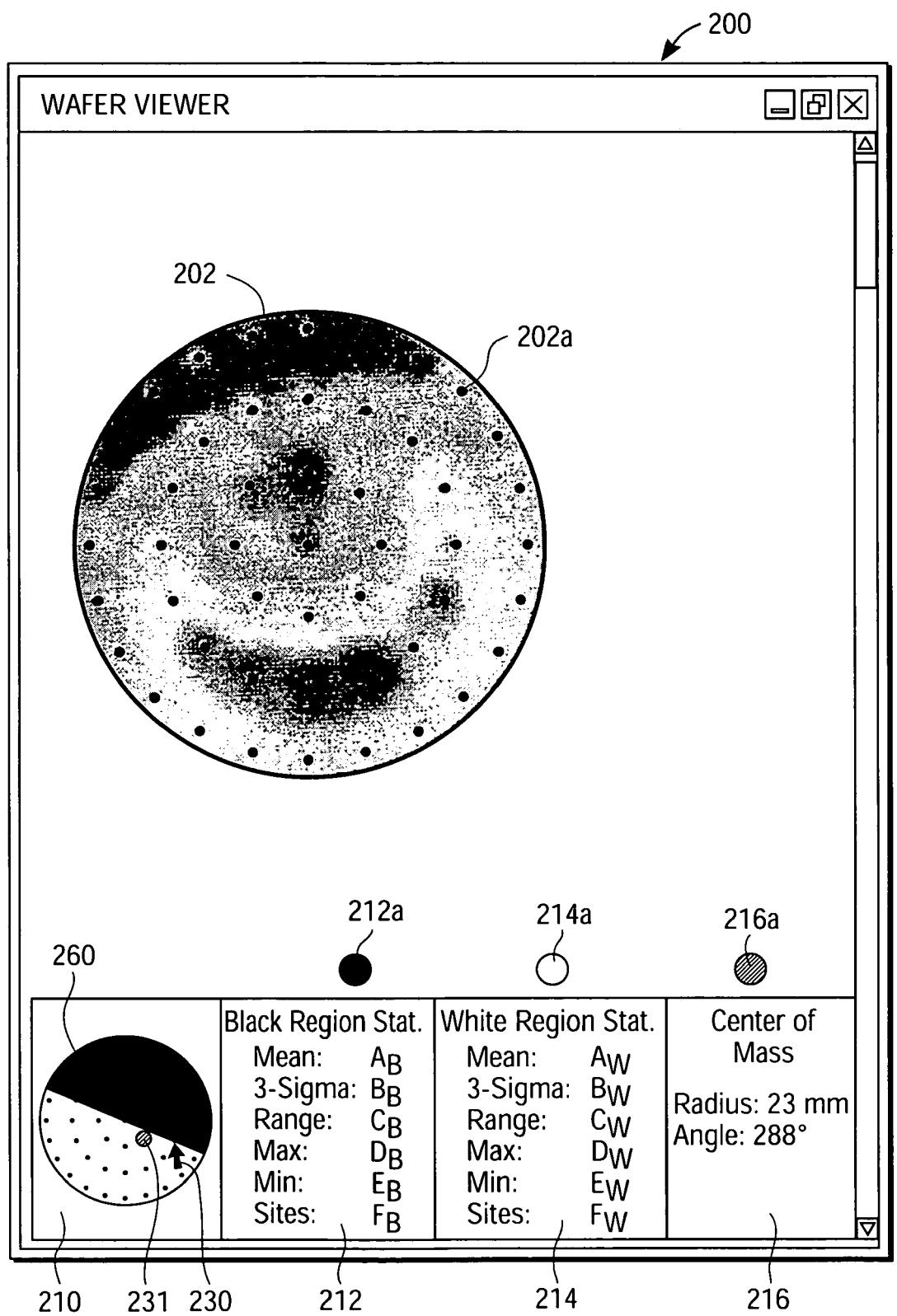

FIG. 3B illustrates the side-to-side control 260 where the pointer 230 was used to rotate the black region to the upper hemisphere of the wafer map 202. As such, it should be evident that the side-to-side control can be shifted to any location around the wafer map to provide more detailed information of particular areas of interest. By providing this detailed information for specific regions of the wafer map, it is possible to further study the significance of the non-uniformities and use those statistical results to adjust process parameters to avoid non-uniformities in future processing operations.

Figure 4A:
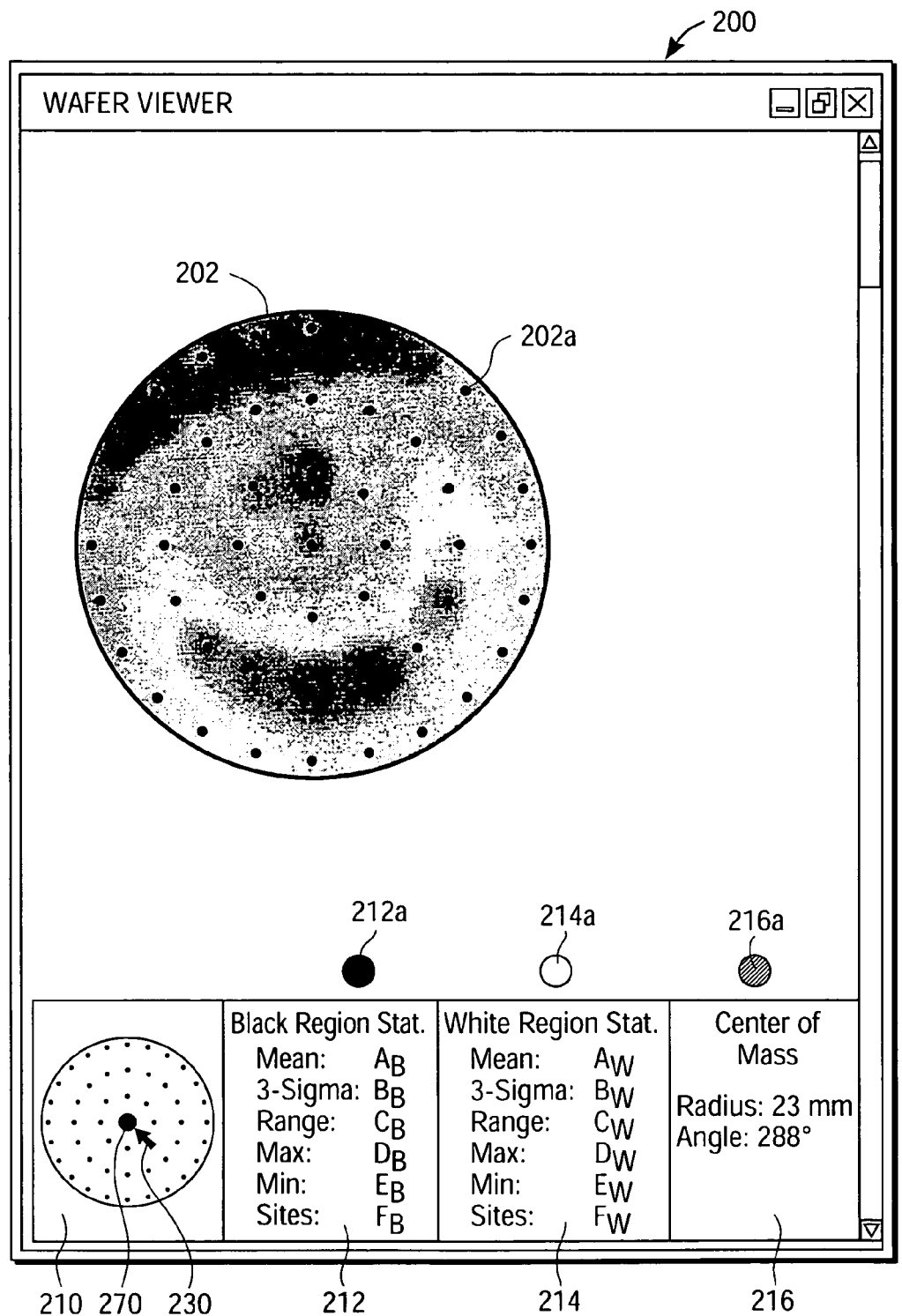
Figure 4B:
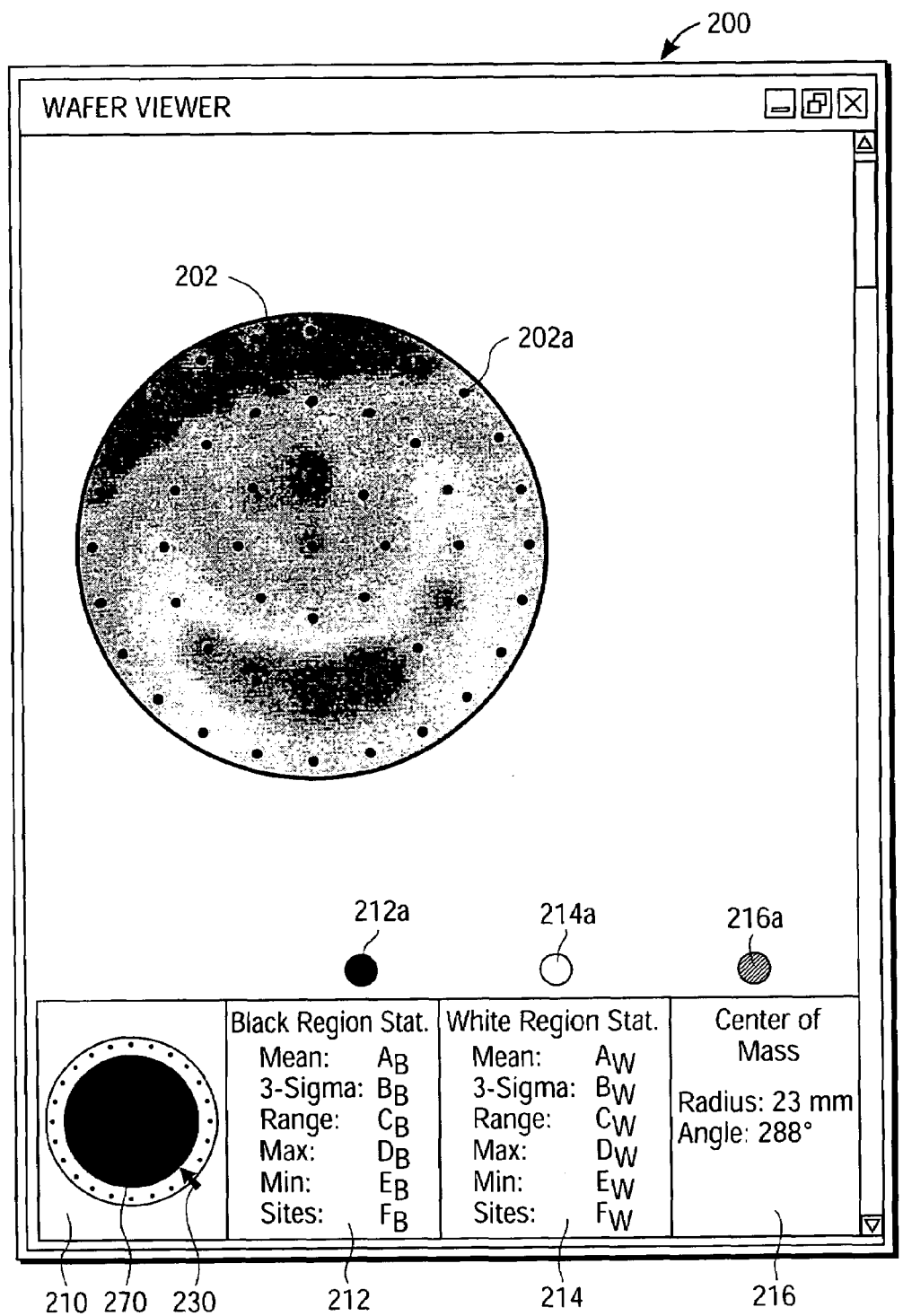

FIGS. 4A and 4B illustrate yet another spatial control 210 parameter, in accordance with one embodiment of the present invention. A center-to-edge control 270 is provided to select a circular black region for those sites that are within the scope of analysis. FIG. 4B illustrates the center-to-edge control 270 once the pointer is used to expand the black region to encompass a substantial center portion of the wafer.

As mentioned above, any time an adjustment is made to the graphical spatial control 210, the black region statistics and the white region statistics 212 and 214, respectively, will automatically adjust to provide on-demand data for those selected regions.

FIG. 5 illustrates a more detailed graphical user display of the wafer viewer 200, in accordance with one embodiment of the present invention. Referring to the top left portion of the wafer viewer 200, wafer data import 290 is provided to allow the user to select which files and for which wafers the wafer viewer 200 will display data for analysis. In one embodiment, files read by wafer viewer 200 are the output files from metrology tools, and they do not need to be preprocessed. Wafer view 200 recognizes file format by the file extension. Wafer view 200 can process files for single wafers, multiple layers, measurements including CD-SEM, and multiple wafers with a single or double data layer (which is common with interferometers and ellipsometers).

Statistics are also provided for the entire wafer in box 280, where the mean, the 3-sigma, the range, the maximum, and the minimum metrics are provided with exemplary values in nanometers (nm). In box 282, a wafer view is provided for allowing the user to select the type of view for analyzing the wafer map 202. In this example, color gradient is selected.

A point density 284 is also provided, and in this example, normal has been selected for the display. An interpolation 286 has been selected to be soft, and an analysis 288 is provided to be cross-sectional, which provides the cross-section control 224, at the top right hand corner of the wafer viewer 200. Check boxes are also provided for "show sites", "show values", "value limits", and so on.

The wafer map 202 is also provided with scan points 202*a* which are identified by actual values at each point. The graphical representation of each value at a given point allows the user to graphically see and understand what value is provided for each of the scan points. In addition, the wafer map 202 is provided with a color variation to identify the particular topographic thickness of the wafer surface being analyzed. The range is also provided using a uniformity color code bar 202*b* which lies beside the wafer map 202, in accordance with one embodiment.

Shown in more detail is also the histogram data source selection window 222' which provides the interpolated map data in window 222 for the wafer histogram. The cross-sectional graph 220 is also provided with graphical and numerical values for quick analysis of the particular cross-section being analyzed in accordance with the cross-sectional line control selection point 224*a*. The cross-section statistics 218 are also provided to illustrate exact numerical values for that particular cross-section. Reference is also drawn to the spatial statistics 210, where the center-to-edge feature has been selected using the spatial distribution control 210*a*.

The selected black region statistics 212 and the white region statistics 214 are also displayed in nanometers (nm) for the particular site selected in each of the regions per the selected spatial distribution parameter. Finally, the center of mass indicator 231 is shown on the spatial statistics 210 and also displayed in polar coordinates in the center of mass display 216. The center of mass, in this example, is shown to be at 44.5 mm away from the center of the wafer and positioned at an angle of 143.2 degrees.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data which can be thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A graphical user interface for controlling analysis of a wafer map, comprising:
    providing a graphical selection control for selecting a region of the wafer map for statistical analysis;
    generating statistical data for the selected region to complete the statistical analysis;
    displaying the statistical data for the selected region; and
    re-generating the statistical data for display upon detecting a change in the selected region.

2. A graphical user interface for controlling analysis of a wafer map as recited in claim 1, wherein the selected region is annular shaped, and the annular shape capable of being dragged to cause the change in the selected region.

3. A graphical user interface for controlling analysis of a wafer map as recited in claim 1, wherein the selected region is half-circular shaped, and the half-circular shape capable of being dragged to cause the change in the selected region.

4. A graphical user interface for controlling analysis of a wafer map as recited in claim 1, wherein the selected region is circular shaped, and the circular shape capable of being dragged to cause the change in the selected region.

5. A graphical user interface for controlling analysis of a wafer map as recited in claim 1, further comprising:
    providing a cross-section for analyzing the wafer map, the cross-section capable of being graphically adjusted to new cross-sectional locations by dragging a cross-sectional control, an adjustment to a new cross-sectional location causing the change in the selection region; and
    presenting statistical data upon detecting the new cross-sectional location.

6. A graphical user interface for controlling analysis of a wafer map as recited in claim 1, further comprising:
    providing a graphical control for selecting a radial value and an angular value of statistical distribution; and
    enabling graphical adjustment of the radial value and the angular value, the radial value and the angular value defining the selected region.

7. A graphical user interface for controlling analysis of a wafer map as recited in claim 1, further comprising:
    providing a graphical representation of a center of mass of surface non-uniformities identified in the wafer map.

8. A graphical user interface for controlling analysis of a wafer map as recited in claim 1, wherein the selected region defines a sub-population analysis, where a complete population analysis is for an entire wafer.

9. A graphical user interface for analyzing data used to generate a wafer map, the wafer map identifying a uniformity profile of a surface that has been etched, the user interface comprising:
    providing a spatial distribution options for selecting sub-population data associated with the uniformity profile of the surface, the sub-population data being a targeted region of the wafer that is less than the entire wafer surface;
    enabling graphical selection of a particular spatial distribution option;
    enabling graphical identification of a region, the region being for the sub-population data; and
    displaying metrics for the region, the metrics being automatically updated upon detecting a change in the graphical identification of the region.

10. A graphical user interface for analyzing data used to generate a wafer map as recited in claim 9, wherein one of the spatial distribution options defines an annular shape that overlaps the sub-population data for analysis, and the annular shape is capable of being positioned to cause a change in the identified region.

11. A graphical user interface for analyzing data used to generate a wafer map as recited in claim 9, wherein one of the spatial distribution options defines a half-circular shaped, and the half-circular shape is capable of being re-positioned to cause a change in the identified region.

12. A graphical user interface for analyzing data used to generate a wafer map as recited in claim 9, wherein one of the spatial distribution options defines a circular shape, and the circular shape capable of being dragged to different sizes to cause the change in the identified region.

13. A graphical user interface for analyzing data used to generate a wafer map as recited in claim 9, further comprising:
    providing a cross-section for analyzing the wafer map, the cross-section capable of being graphically adjusted to new cross-sectional locations by dragging a cross-sectional control, an adjustment to a new cross-sectional location causing the change in the identified region; and
    presenting statistical data upon detecting the new cross-sectional location.

14. A graphical user interface for analyzing data used to generate a wafer map as recited in claim 9, further comprising:
    providing a graphical control for selecting a radial value and an angular value of statistical distribution; and
    enabling graphical adjustment of the radial value and the angular value, the radial value and the angular value defining the identified region for the sub-population data.

15. A graphical user interface for analyzing data used to generate a wafer map as recited in claim 9, further comprising:
    providing a graphical representation of a center of mass of surface non-uniformities identified in the wafer map.

16. A graphical user interface for analyzing data used to generate a wafer map as recited in claim 9, wherein the selected region defines the sub-population analysis, where a complete population analysis is for an entire wafer.

17. A graphical user interface for displaying and graphically controlling selection of metrics to analyze post process wafer surface areas, the user interface receiving data used to generate a wafer map, the wafer map identifying a uniformity profile of a surface that has been etched, the user interface comprising:

providing a spatial distribution options for selecting sub-population data associated with the uniformity profile of the surface, the sub-population data being a targeted region of the wafer that is less than the entire wafer surface;

enabling graphical identification of a region using a particular spatial distribution option, the region being for the sub-population data; and displaying metrics for the region, the metrics being automatically updated upon detecting a change in the graphical identification of the region.

18. A graphical user interface for displaying and graphically controlling selection of metrics to analyze post process wafer surface areas 17, wherein one of the spatial distribution options defines an annular shape that overlaps the sub-population data for analysis, and the annular shape is capable of being positioned to cause a change in the identified region.

19. A graphical user interface for displaying and graphically controlling selection of metrics to analyze post process wafer surface areas 17, wherein one of the spatial distribution options defines a half-circular shaped, and the half-circular shape is capable of being re-positioned to cause a change in the identified region.

20. A graphical user interface for displaying and graphically controlling selection of metrics to analyze post process wafer surface areas 17, wherein one of the spatial distribution options defines a circular shape, and the circular shape capable of being dragged to different sizes to cause the change in the identified region.

21. A graphical user interface for displaying and graphically controlling selection of metrics to analyze post process wafer surface areas 17, further comprising:

providing a cross-section for analyzing the wafer map, the cross-section capable of being graphically adjusted to new cross-sectional locations by dragging a cross-sectional control, an adjustment to a new cross-sectional location causing the change in the identified region; and presenting statistical data upon detecting the new cross-sectional location.

22. A graphical user interface for displaying and graphically controlling selection of metrics to analyze post process wafer surface areas 17, further comprising:

providing a graphical control for selecting a radial value and an angular value of statistical distribution; and enabling graphical adjustment of the radial value and the angular value, the radial value and the angular value defining the identified region for the sub-population data.

* * * * *